United States Patent [19]
Arimoto et al.

[11] Patent Number: 5,467,731
[45] Date of Patent: Nov. 21, 1995

[54] METHOD OF PRODUCING A SEMICONDUCTOR STRUCTURE INCLUDING A RECRYSTALLIZED FILM

[75] Inventors: Satoshi Arimoto; Norio Hayafuji; Mikio Deguchi; Satoshi Hamamoto, all of Itami, Japan

[73] Assignee: Mitsubishi Denki Kabushiki Kaisha, Tokyo, Japan

[21] Appl. No.: 322,375

[22] Filed: Oct. 13, 1994

Related U.S. Application Data

[62] Division of Ser. No. 151,823, Nov. 15, 1993, abandoned.

[30] Foreign Application Priority Data

Feb. 26, 1993 [JP] Japan ................................. 5-037205

[51] Int. Cl.⁶ ................................................. C30B 13/20
[52] U.S. Cl. ................................ 117/43; 117/44; 117/45
[58] Field of Search ................................ 117/43, 44, 45

[56] References Cited

U.S. PATENT DOCUMENTS

| | | | |
|---|---|---|---|
| 4,371,421 | 2/1983 | Fan et al. | 428/620 |
| 4,479,846 | 10/1984 | Smith et al. | 117/43 |
| 4,752,590 | 6/1988 | Adams et al. | 437/21 |
| 4,885,052 | 12/1989 | Fan et al. | 117/43 |
| 4,888,302 | 12/1989 | Ramesh | 117/44 |
| 4,888,304 | 12/1989 | Nakagawa et al. | 437/86 |
| 4,891,092 | 1/1990 | Jastrzebski | 117/97 |
| 4,944,835 | 7/1990 | Allen et al. | 117/902 |
| 5,290,712 | 3/1994 | Sato et al. | 437/24 |
| 5,294,556 | 3/1994 | Kawamura | 437/21 |

FOREIGN PATENT DOCUMENTS

| | | | |
|---|---|---|---|
| 184290 | 10/1985 | European Pat. Off. | |
| 62-7116 | 1/1987 | Japan | 117/43 |
| 2-7414 | 1/1990 | Japan | 117/43 |
| 2-7415 | 1/1990 | Japan | 117/43 |
| 2126631 | 5/1990 | Japan | |
| 2224323 | 9/1990 | Japan | |
| 8904550 | 11/1988 | WIPO | |

OTHER PUBLICATIONS

Fan et al, "Graphite-strip-heater zone-melting Recrystallization of Si films" Journal of Crystal Growth 63 (1983), 453–483.

D. Dutartre, "Zone Melting Recrystallization of Thin Si Films: Effect of Relief in the $SiO_2$ Cap", J. Electrochem, Soc., vol.136 No. 9, Sep. 1989, pp. 2691–2695.

Chen et al, "Zone-Melting Recrystallization With Enhanced Radiative Heating for Preparation of Subboundary-Free Silicon-on-Insulator Thin Films", Applied Physics Letter No. 55 (12), 18 Sep. 1989, pp. 1238–1240.

Geis et al, "Solidification-Front Modulation to Entrain Subboundaries in Zone-Melting Recrystallization of Si on $SiO_2$", J. Electrochem. Soc.: Solid-State Science and Technology, May 1983, pp. 1178–1183.

(List continued on next page.)

Primary Examiner—Robert Kunemund
Attorney, Agent, or Firm—Leydig, Voit & Mayer

[57] ABSTRACT

A method for producing a semiconductor structure including a semiconductor film formed on a semiconductor substrate body via an insulating film includes: laminating a first insulating film, a first semiconductor film, and a second insulating film on the semiconductor substrate successively; forming stripe-shaped second semiconductor films of predetermined width on the second insulating film arranged periodically at a predetermined interval and covering these second semiconductor films with a third insulating film; performing zone melting recrystallization of the first semiconductor film from one end of the substrate to the opposite end along the stripe direction of the stripe-shaped second semiconductor film; etching the third insulating film and portions of the second insulating film not sandwiched by the first and second semiconductor films; oxidizing portions of the second semiconductor film and the first semiconductor film exposed in the etching step and etching and removing the second insulating film remaining after the previous etching. Thus, a semiconductor substrate including a recrystallized semiconductor film having removed sub-grain-boundaries generated during the zone melting recrystallization, is obtained by fewer process steps than in the prior art.

10 Claims, 17 Drawing Sheets

OTHER PUBLICATIONS

R. T. Gallagher, "Silicon on Insulator Attains High Yields by Boundary Control", Electronics. DE 1984 A 1985:Electronics Week vol. 56, No. 9, May 1983, New York, pp. 85–86.

Extended Abstracts of the 18th (1986 International) Conference on "Solid State Devices and Materials," IEEE, Aug. 1986.

Fan, et al. "Oxygen in zone–melting–recrystallized silicon–on–insulator films: Its distribution and possible role in sub–boundary formation," Appl. Phys. Lett. 44(11), 1 Jun. 1984.

Chiang, et al. "Semiconductor–on–Insulator and Thin Film Transistor Technology," Materials Research Society Symposium Proceedings, 1986.

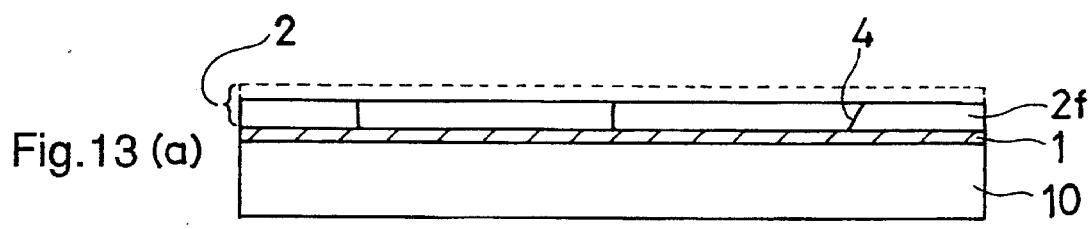
Fig.13 (a)
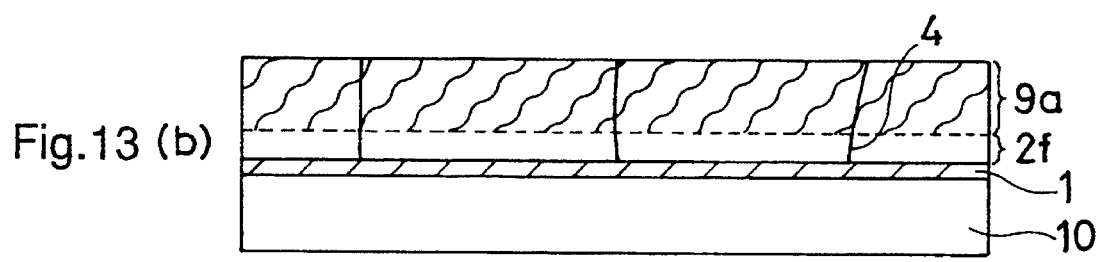
Fig.13 (b)
Fig.14
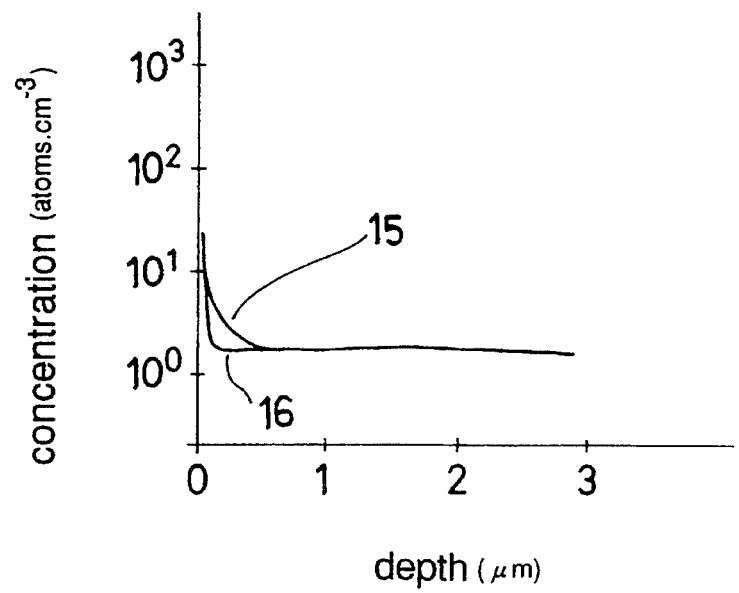

METHOD OF PRODUCING A SEMICONDUCTOR STRUCTURE INCLUDING A RECRYSTALLIZED FILM

This disclosure is a divisional of application Ser. No. 08/151,823, filed Nov. 15, 1993 now abandoned.

FIELD OF THE INVENTION

The present invention relates to a semiconductor substrate and, more particularly to a semiconductor substrate on which a semiconductor film, having crystalline grains, whose dimensions are increased by zone melting recrystallization, is formed on an insulating film. This invention also relates to a production method of the semiconductor substrate.

BACKGROUND OF THE INVENTION

FIGS. 18(a) and 18(b) are a cross-sectional view and a perspective view, respectively, illustrating process steps for producing a semiconductor substrate according to the prior art. The production method of the semiconductor substrate will be described with reference to these figures.

First, as shown in FIG. 18(a), an insulating film 1 comprising, silicon oxide is formed in a thickness of about 1 μm on a semiconductor substrate 10 comprising, for example, monocrystalline silicon. A semiconductor film 2 comprising amorphous silicon or polycrystalline silicon is formed in a thickness of approximately 0.5 to 5 μm on the insulating film 1. An insulating film 3 comprising a silicon oxide film and a silicon nitride film which are laminated is formed in a thickness of approximately 1 to 3 μm on the semiconductor film 2. A semiconductor substrate material 500 is thus produced.

Next, as shown in FIG. 18(b), the semiconductor substrate material 500 obtained as described above is placed on a lower side heater 20a comprising carbon. An upper side strip heater 20b comprising carbon is disposed above the substrate material 500 a predetermined distance from the substrate material 500. The upper side strip heater 20b is scanned over the substrate material 500 from an end of the substrate material 500 to the opposite end at a predetermined speed of, for example, 1 mm/sec to zone melt and recrystallize the semiconductor thin film 2 in the substrate material 500. Then, in the semiconductor thin film 2, crystal grain size is increased by zone melting recrystallization, resulting in improved electrical characteristics such as improved electric conductivity of the semiconductor thin film 2. Here, an infrared lamp may be used in place of the carbon strip heater 20b.

FIGS. 19(a) and 19(b) are a cross-sectional view and a plan view, respectively, both illustrating the semiconductor substrate material 500 obtained by the above-described process. In the semiconductor thin film 2 in the semiconductor substrate material 500, crystal grain size is increased by zone melting and recrystallization, resulting in improved electrical characteristics such as electric conductivity. At the same time, however, some crystalline defects, such as sub-grain-boundaries 4 and dislocations 5, are generated in the semiconductor thin film 2 as shown in the figures. These sub-grain-boundaries 4 and dislocations 5 serve as cores for recombination of carriers, i.e., electrons and holes, after the device is produced, and these sub-grain-boundaries and dislocations cause an increase in a dark current of a light-responsive device. Especially, because sub-grain-boundary 4 is an aggregate of dislocations 5, in order to improve the device characteristics, it is important to reduce sub-grain-boundaries 4 and to produce sub-grain-boundaries 4 at positions where sub-grain-boundaries 4 do not aversely affect device characteristics. Here, sub-grain-boundary 4 is supposed to be caused at the solid-liquid phase interface which is generated in the semiconductor thin film 2 during zone melting and recrystallization.

FIGS. 20(a) and 20(b) are cross-sectional views illustrating conventional process steps for producing a semiconductor substrate which is improved so as to control the positions of sub-grain-boundaries in view of the above-described problems, as disclosed in "Journal of Electrochemical Society, Vol. 130, No.5, pages 1178 to 1183". In the figures, the same reference numerals as those in FIGS. 18(a) to 19(b) designate the same or corresponding elements, and reference numeral 20 designates carbon stripes of about 7 μm thickness. The process steps will be described below.

First, as shown in FIG. 20(a), similar to the process step shown in FIG. 18(a), an insulating film 1 comprising a silicon oxide film, a semiconductor film 2 comprising amorphous silicon or polycrystalline silicon, and an insulating film 3 comprising a silicon oxide film and a silicon nitride film which are laminated are successively deposited in this order on a substrate 10 comprising monocrystalline silicon. Carbon stripes 20 of 7 μm thickness are periodically disposed on film 3 with a predetermined interval of approximately 100 to 200 μm to provide a semiconductor substrate material 500a.

Next, similar to the process step shown in FIG. 18(b), when zone melting and recrystallization of the semiconductor film 2 is carried out along the direction of the carbon stripes 20 using a carbon strip heater, the heat from the carbon strip heater is absorbed by the carbon stripes 20, so that a significant amount of heat is transfered to the portions of the semiconductor film 2 located below the carbon stripes 20. Therefore, a temperature distribution according to the positions of the carbon stripes 20 is formed in the semiconductor film 2, the solid-liquid phase interface is modulated by the temperature distribution, and sub-grain-boundaries 4 are produced in the semiconductor film 2 only below the carbon stripes 20. In this way, not only sub-grain-boundaries 4 can be controlled to particular positions but also the number of sub-grain-boundaries 4 can be reduced. The reason why the carbon stripes 20 are formed with intervals of approximately 100 to 200 μm is because if the interval is larger than 200 μm, sub-grain-boundaries 4 are unfavorably generated at portions of the semiconductor film 2 other than below the carbon stripes 20. This method cannot reduce the number of dislocations.

FIGS. 21(a) and 21(b) are cross-sectional views illustrating process steps for producing a semiconductor substrate in accordance with "Extended Abstracts of the 18th (1986 International) Conference on Solid State Devices and Materials, Tokyo, 1986, pages 565 to 568". In the figures, the same reference numerals as those in FIGS. 18(a) to 20(b) designate the same or corresponding elements. The process steps will be described below.

In the process steps, as shown in FIG. 21(a), a predetermined region in a substrate 10 comprising monocrystalline silicon is oxidized to form an insulated region 1a. A semiconductor thin film 2 comprising amorphous silicon or polycrystalline silicon is formed on the substrate 10 comprising monocrystalline silicon. A silicon nitride film 3a having thick stripe portions 3b arranged periodically at a predetermined interval is formed on the semiconductor thin film 2 to provide a semiconductor substrate material 500b. Then, the thickness of the thin portion of the silicon nitride film 3a is, for example, 60 Å, and the thickness of the thick stripe portion 3b of the silicon nitride film 3a is 550 Å.

Next, laser light from a laser light source (not shown)

irradiates the surface of the silicon nitride film 3a and the laser light is scanned at a predetermined speed along the stripe direction of the thick stripe portion 3b to carry out the zone melting recrystallization of the semiconductor thin film 2. During the zone melting recrystallization, as shown in FIG. 21(b), since the thick stripe portions 3b of the silicon nitride film 3a are heated more than other portions, more heat is applied to the portions of the semiconductor film 2 below the stripe portions 3b, so that sub-grain-boundaries 4 are produced at the portions of those semiconductor film 2. As for the zone melting and recrystallization, a portion 10a of the substrate 10 comprising monocrystalline silicon, contacting the semiconductor film 2, acts as a seed, and the zone melting recrystallization proceeds along a crystalline direction of the substrate 10 comprising monocrystalline silicon including no defects, resulting in reduced dislocations 5 as compared with the case where the zone melting recrystallization is carried out as shown in FIGS. 20(a) and 20(b), whereby the defect density is reduced.

As described above, in the prior art process steps for producing a semiconductor substrate, in the zone melting and recrystallization of a semiconductor film, carbon stripes of predetermined width are periodically disposed on the upper surface of an insulating film covering the semiconductor film, or the semiconductor film is covered with an insulating film having thick stripe-shaped portions periodically arranged on the insulating film, whereby the number of sub-grain-boundaries generated in the semiconductor film is reduced, and adverse effects on the device characteristics by sub-grain-boundaries after a semiconductor device is actually produced are reduced to a great extent by controlling the positions of sub-grain-bounderies.

However, as long as sub-grain-boundaries exist in the semiconductor film, deterioration of device characteristics cannot be completely avoided. Accordingly, in order to further improve device characteristics, it is necessary to completely remove sub-grain-boundaries from the recrystallized semiconductor film or to inactivate sub-grain-boundaries in the semiconductor film. In order to realize this, it is thought to carry out a required patterning of the semiconductor substrate obtained by the process steps shown in FIG. 20 or 21 to remove or inactivate the sub-grain-boundary portions. In the process steps shown in FIGS. 20(a) to 20(b), however, after removing carbon stripes 20 or insulating film 3a comprising a silicon nitride film, a further mask pattern is required to be produced to remove or inactivate the sub-grain-boundary portions. When process steps for forming the mask pattern and removing the same are added, the process for producing the semiconductor substrate as a whole is complicated. In addition, if the positional accuracy in producing the mask pattern is reduced, complete removal of sub-grain-boundaries is disabled.

Furthermore, in the above-described prior art process steps for producing a semiconductor substrate, in order to for zone melting and recrystallization of a semiconductor film uniformly in the semiconductor film to occur, the thickness of the semiconductor film is limited to approximately 5 μm which is described above. Accordingly, when a semiconductor film of more than several μm thickness, more concretely, approximately 50 to 100 μm, which is used in such as a solar cell, is formed, there are problems that not only crystalline grain size in the semiconductor film cannot be increased, but also defects are increased.

SUMMARY OF THE INVENTION

It is an object of the present invention to provide a production method of a semiconductor substrate including a semiconductor film on the substrate body via an insulating film by zone melting recrystallization, in a state where sub-grain-boundaries generated in the semiconductor film during the zone melting recrystallization are completely removed or inactivated, by simple process steps.

It is another object of the present invention to provide a semiconductor substrate formed on the substrate body via an insulating film, having a semiconductor film of more than several in thickness, including crystalline grains of increased sized and almost no crystalline defects such as sub-grain-boundaries.

It is still another object of the present invention to provide a method for producing the above-described semiconductor substrate.

Other objects and advantages of the present invention will become apparent from the detailed description given below; it should be understood, however, that the detailed description and specific embodiment are given by way of illustration only, since various changes and modifications within the spirit and scope of the invention will become apparent to those skilled in the art from this detailed description.

According to a first aspect of the present invention, in a production method of a semiconductor substrate, stripe-shaped second semiconductor films, used for controlling the positions of sub-grain-boundaries during zone melting recrystallization of a first semiconductor film on a semiconductor substrate body, serve as masks for removing the sub-grain-boundaries in the first semiconductor film. Thus, a semiconductor substrate including a recrystallized semiconductor film formed on the substrate body via an insulating film, is obtained by fewer process steps than in the prior art.

According to a second aspect of the present invention, in a semiconductor substrate and a production method thereof, after the sub,grain-boundaries in the first semiconductor film are removed, a further semiconductor film is epitaxially grown on the first semiconductor film. Thus, a semiconductor substrate including a semiconductor film on the substrate body via an insulating film, having superior crystallinity, including no sub-grain-boundary, and having a thickness of more than several μm, is obtained.

According to a third aspect of the present invention, in a production method of a semiconductor substrate, stripe-shaped second semiconductor films, used for controlling the positions of sub-grain-boundaries during zone melting recrystallization of a first semiconductor film, are used as masks for inactivating the sub-grain-boundaries by the diffusion of an impurity. Thus, a semiconductor substrate including a recrystallized semiconductor film formed on the substrate body via an insulating film, is obtained by fewer process steps than in the prior art.

According to a fourth aspect of the present invention, in a semiconductor substrate and a production method thereof, after the sub-grain-boundaries in the first semiconductor film are inactivated, a further semiconductor film is epitaxially grown on the first semiconductor film. Thus, a semiconductor substrate including a semiconductor film on the substrate body via an insulating film, having superior crystallinity, including no sub-grain-boundary, and having a thickness of more than several μm, is obtained.

According to a fifth aspect of the present invention, in a production method of a semiconductor substrate, a semiconductor film on which stripe-shaped grooves are periodically arranged at a predetermined interval is recrystallized. Thereafter a portion of the semiconductor film is removed to a predetermined depth so as to remove sub-grain-boundaries generated in the semiconductor film. Thus, a semiconductor substrate including a recrystallized semiconductor film on the substrate body via an insulating film, is obtained by fewer process steps than in the prior art.

According to a sixth aspect of the present invention, in a semiconductor substrate and a production method thereof, after sub-grain-boundaries in a semiconductor film are removed, a further semiconductor film is epitaxially grown on the semiconductor film. Thus, a semiconductor substrate including"a semiconductor film on the substrate body via an insulating film, having superior crystallinity, including no sub-grain-boundaries and having a thickness of more than several μm, is obtained.

According to a seventh aspect of the present invention, in a production method of a semiconductor substrate, after a semiconductor film is recrystallized, a surface portion of the semiconductor film is oxidized, and the oxidized surface portion is removed. Thus, a semiconductor substrate including a recrystallized semiconductor film on the substrate body via an insulating film, with sub-grain-boundaries inactivated by oxidation, is obtained.

According to an eighth aspect of the present invention, in a semiconductor substrate and a production method thereof, after the surface portion of the semiconductor film is removed and a semiconductor film is further epitaxially grown on the semiconductor film that has inactivated sub-grain-boundaries. Thus, a semiconductor substrate including a semiconductor film formed on the substrate body via an insulating film, having superior crystallinity, free of sub-grain-boundaries and having a thickness of more than several μm, is obtained.

According to a ninth aspect of the present invention, in a production method of a semiconductor substrate, a first semiconductor film is recrystallized with stripe-shaped second semiconductor films periodically disposed at a predetermined interval opposite the first semiconductor film, and thereafter other portions of the first semiconductor film, i.e., portions where sub-grain-boundaries are generated, and further the stripe-shaped second semiconductor films are removed. Thus, a semiconductor substrate including a recrystallize semiconductor film formed on the substrate body via an insulating film, without crystalline sub-boundaries is obtained with fewer process steps than in the prior art.

According to a tenth aspect of the present invention, in a semiconductor substrate and a production method thereof, after sub-grain-boundaries in the semiconductor film are removed, a further semiconductor film are epitaxially grown on the semiconductor film. Thus, a semiconductor substrate including a semiconductor film formed on the substrate body via an insulating film, having superior crystallinity free of sub-grain-boundaries and having a thickness of more than several μm, is obtained.

According to an eleventh aspect of the present invention, in a semiconductor substrate and a production method thereof, a first semiconductor film is recrystallized with stripe-shaped second semiconductor films periodically arranged opposite the first semiconductor film at a predetermined interval, and the stripe-shaped second semiconductor films are removed leaving an insulating film only on portions of the first semiconductor film where sub-grain-boundaries are generated, and thereafter, a third semiconductor film is epitaxially grown thereon. Thus, a semiconductor substrate including a semiconductor film formed on the substrate surface via an insulating film, having superior crystallinity, free of sub-grain-boundaries and having a thickness of more than several μm, can be obtained.

According to a twelfth aspect of the present invention, in a semiconductor substrate and a production method thereof, after zone melting recrystallization of the semiconductor film, the semiconductor film is removed to a predetermined depth from the surface to expose portions of the semiconductor film having low oxygen density, and thereafter a further semiconductor film is epitaxially grown thereon. Thus, a semiconductor substrate including a semiconductor film having superior crystallinity, free of line defects originating from sub-grain-boundaries and having a thickness of more than several μm, is obtained.

According to a thirteenth aspect of the present invention, in a semiconductor substrate and a production method thereof, apertures are formed in an insulating film on a recrystallized first semiconductor film not overlapping with sub-grain-boundaries in the first semiconductor film, thereafter a second semiconductor film is epitaxially grown thereon, and then zone melting and recrystallization of the second semiconductor film is carried out using portions of the first semiconductor film in which no sub-grain-boundary is produced as seeds. Thus a semiconductor substrate including a recrystallized semiconductor film formed on the substrate body via an insulating film, having superior crystallinity and free of sub-grain-boundaries, is obtained.

BRIEF DESCRIPTION OF THE DRAWINGS

FIGS. 13(a) and 13(b) are cross-sectional views illustrating process steps for producing a semiconductor substrate in accordance with a tenth embodiment of the present invention.

FIG. 14 is a diagram showing the relation between depth from the surface of a recrystallized semiconductor film and oxygen concentration.

DETAILED DESCRIPTION OF THE PREFERRED EMBODIMENTS

Embodiment 1

Figure 1:
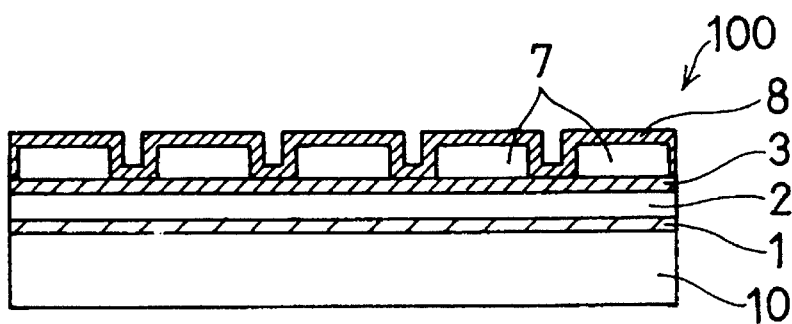
FIG. 1(a) to 1(e) are cross-sectional views illustrating process steps for producing a semiconductor substrate in accordance with a first embodiment of the present invention.
Figure 1:
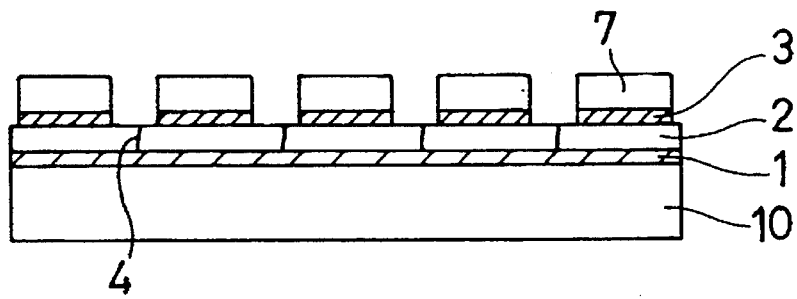
Figure 1:
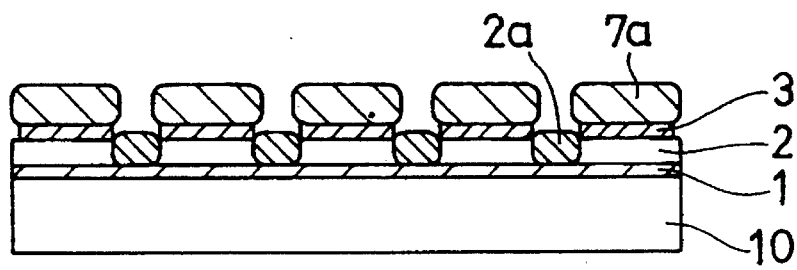
Figure 1:
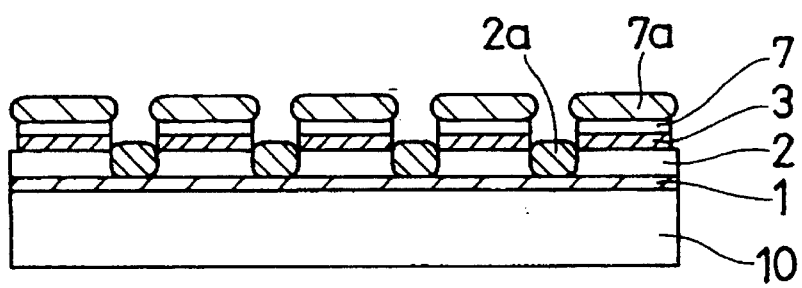
Figure 1:
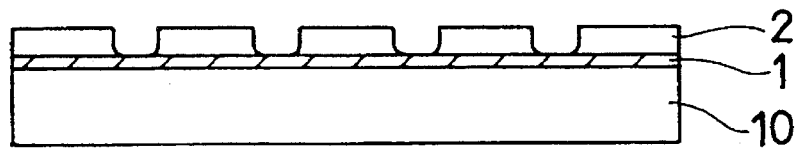

FIGS. 1(a) to 1(e) are cross-sectional views illustrating process steps for producing a semiconductor substrate in accordance with a first embodiment of the present invention. In the figures, the same reference numerals as those in FIGS. 18(a) and 18(b) designate the same or corresponding elements.

A description will be given of the process steps with reference to FIGS. 1(a) to 1(e).

As in the prior art, an insulating film 1 comprising a silicon oxide film has a thickness of about 1 μm on a substrate 10 comprising, for example, monocrystalline silicon. A semiconductor film 2 comprising amorphous silicon or polycrystalline silicon is formed in a thickness of approximately 0.5 to 5 μm on the insulating film 1. An insulating film 3 comprising a silicon oxide film and a silicon nitride film which are laminated is formed in a thickness of approximately 1 to 3 μm on the semiconductor film 2. Stripe-shaped semiconductor films 7 comprising amorphous silicon or polycrystalline silicon, each having a width within 100 to 200 μm, are formed periodically with an interval of approximately 10 to 20 μm on the insulating film 3. An insulating film 8 comprising a silicon oxide film and a silicon nitride film which are laminated covers the stripe-shaped semiconductor films 7 and exposed portions of the insulating film 3 between the stripe-shaped semiconductor films 7. In this way, a semiconductor substrate material 100 shown in FIG. 1(a) is produced.

Next, as in the prior art, a carbon strip heater is disposed above the semiconductor substrate material 100 in such a manner that the length direction of the heater is perpendicular to the stripe direction of the stripe-shaped semiconductor film 7, and the strip heater is scanned over the semiconductor substrate material 100 along the stripe direction of the stripe-shaped semiconductor film 7 from one end of the semiconductor material 100 to the opposite end at a prescribed speed of, for example, 1 mm/sec. By this operation, the semiconductor film 2 is zone melted and crystallized, whereby the crystal grain size is increased and the electrical characteristics such as electric conductivity are improved. Because heat is intercepted by the stripe-shaped semiconductor films 7, much heat is conducted to portions of the semiconductor film 2 above which no stripe-shaped semiconductor film 7 is disposed. Thereby, a temperature distribution is formed in the semiconductor film 2, resulting in sub-grain-boundaries 4 being produced at the portions of the semiconductor film 2 above which no stripe-shaped semiconductor film 7 is formed. Here, the reason why the width of the stripe-shaped semiconductor film 7 is set in a range between 100 and 200 μm is because if the stripe-shaped semiconductor film is wider than 200 μm, sub-grain-boundaries may also be generated at portions of the semiconductor film 2 above which the stripe-shaped semiconductor films 7 are disposed, that is, sub-grain-boundaries may be unfavorably produced at irregular and unpredictable portions. The reason why the stripe-shaped semiconductor films 7 are formed with an interval of approximately 10 to 20 μm is to produce sub-grain-boundaries with good controllability at portions of the semiconductor film 2 above which no stripe-shaped semiconductor film 7 is disposed, and if the stripe-shaped semiconductor films 7 are formed in a width other than that range, sub-grain-boundaries may be unfavorably generated at portions of the semiconductor film 2 above which the stripe-shaped semiconductor films 7 are formed.

Figure 2:
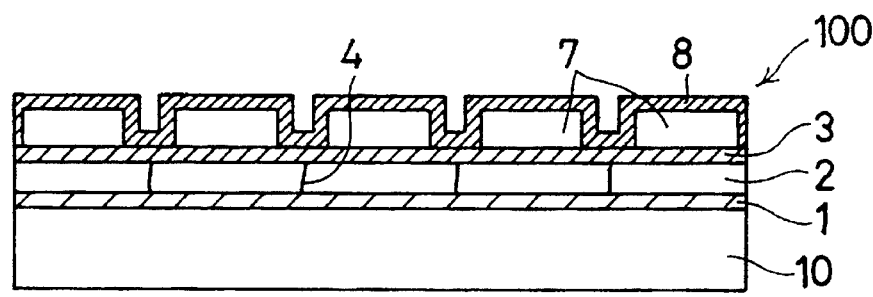
FIGS. 2(a) and 2(b) are a cross-sectional view and a plan view, respectively, illustrating an inner structure of a semiconductor film for zone melting recrystallization in a process step of the first embodiment.
Figure 2:
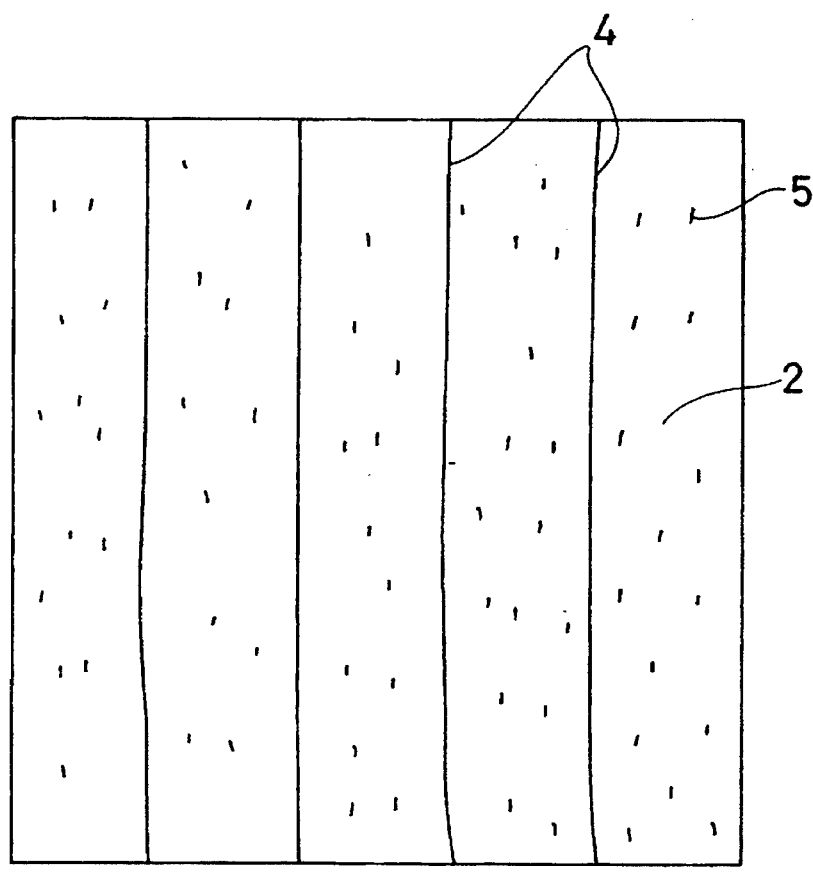

FIGS. 2(a) and 2(b) are a cross-sectional view and a plan view, respectively, illustrating the semiconductor substrate material 100 after the above-described process steps, and showing a state where sub-grain-boundaries are produced at portions of the semiconductor film 2 above which no stripe-shaped semiconductor film 7 is formed. Reference numeral 5 designates a dislocation.

As shown in FIG. 1(b), the insulating film 8 and the insulating film 3 between the adjacent stripe-shaped semiconductor films 7 are removed to expose the stripe-shaped semiconductor films 7 and the semiconductor film 2. Thereafter, as shown in FIG. 1(c), the exposed portions of the semiconductor film 2, i.e., portions of the semiconductor film 2 in which sub-grain-boundaries 4 are produced, are oxidized using the stripe-shaped semiconductor films 7 as masks. During the oxidation, sub-grain-boundaries 4 in the semiconductor film 2 are inactivated, while the stripe-shaped semiconductor films 7 are also oxidized. In FIGS. 1(c) and 1(d), reference numeral 2a designates an oxidized region in the semiconductor film 2, and reference numeral 7a designates an oxidized region in the semiconductor film 7. The degree of oxidation of the stripe-shaped semiconductor films 7 may be such that the semiconductor films 7 are entirely oxidized, i.e., all of the semiconductor films 7 become the oxidized portions 7a as shown in FIG. 1(c), or such a degree that non-oxidized portions 7 remain under the oxidized portions 7a as shown in FIG. 1(d).

Next, as shown in FIG. 1(e), when the semiconductor films 7 including the oxidized regions 7a and the insulating film 3 are etched away with, for example, hydrofluoric acid in aqueous solution, the oxidized regions 2a of the semiconductor film 2 are also etched away, resulting in the semiconductor film 2 from which sub-grain-boundaries 4 are removed. Then, because the sub-grain-boundaries 4 are already inactivated by the above-described process step, parts of the oxidized regions 2a may be left without being completely removed.

In the above-described process steps for producing the semiconductor substrate of this first embodiment, at zone melting recrystallization of the semiconductor film 2, the stripe-shaped semiconductor films 7 provided for controlling generation of sub-grain-boundaries 4 serve as masks for removing or inactivating sub-grain-boundaries 4 after the zone melting recrystallization. Thus, further mask patterns for removing or inactivating sub-grain-boundaries, required in the prior art, are not required in this first embodiment. Therefore, a semiconductor substrate including a recrystallized semiconductor film formed on the substrate body via an insulating film, from which semiconductor film sub-grain-boundaries are removed or in which semiconductor film they are inactivated by fewer process steps than in the prior art, can be obtained.

Embodiment 2

Figure 3:
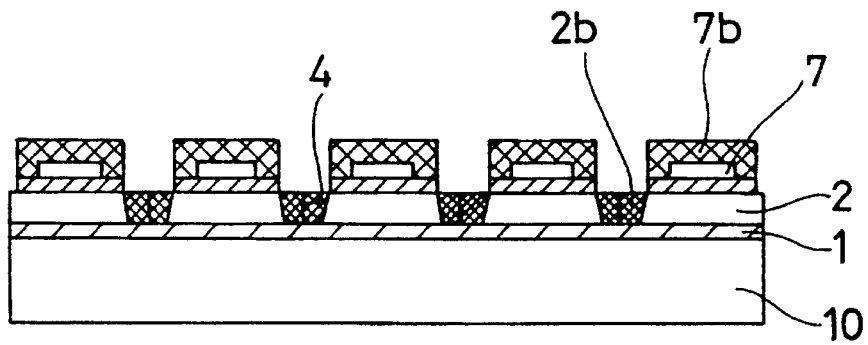
FIGS. 3(a) and 3(b) are cross-sectional views illustrating process steps for producing a semiconductor substrate in accordance with a second embodiment of the present invention.
Figure 3:
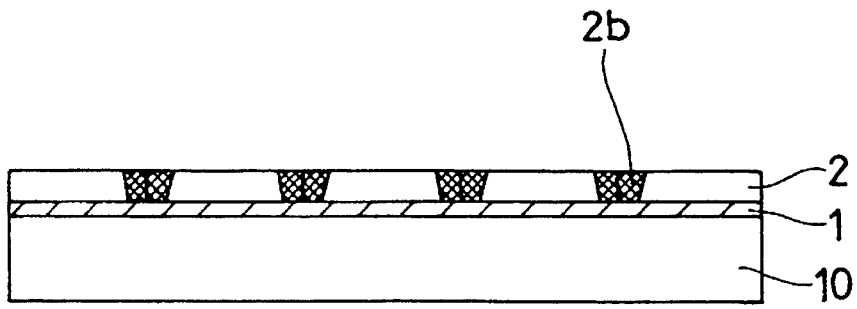

FIGS. 3(a) and 3(b) are cross-sectional views illustrating process steps for producing a semiconductor substrate in accordance with a second embodiment of the present invention. In the figures, the same reference numerals as those in FIGS. 1(a) to 1(e) designate the same or corresponding elements.

The process steps will be described with reference to FIGS. 3(a) and 3(b) below.

First, the same process steps as shown in FIG. 1(a) and 1(b) are conducted.

Next, as shown in FIG. 3(a), when impurities are diffused into the semiconductor film 2 using the stripe-shaped semiconductor films 7 as masks, impurity diffused regions 2b are formed at portions of the semiconductor film 2 where no stripe-shaped semiconductor film 7 is formed, whereby sub-grain-boundaries 4 generated in the regions 2a are inactivated. As the impurity used here, an impurity such as phosphorus (P) producing n-type conductivity is used when the semiconductor film 2 is p type, while an impurity such as boron (B) producing p-type conductivity is used when the semiconductor film 2 is n type. Then, impurity diffused region 7 b is also formed in the stripe-shaped semiconductor films 7.

Next, the insulating film 3 is etched with hydrofluoric acid in aqueous solution to remove the insulating film 3 and the stripe-shaped semiconductor films 7 including the impurity diffused regions 7 b. Thus, as shown in FIG. 3(b), the semiconductor film 2 in which sub-grain-boundaries 4 are inactivated by the impurity diffused regions 2b can be obtained.

In the process steps for producing the semiconductor substrate of this second embodiment, the stripe-shaped semiconductor films 7 provided for controlling the positions of sub-grain-boundaries 4 become masks for inactivating sub-grain-boundaries 4 after the zone melting recrystallization of the semiconductor film 2, whereby further mask patterns for removing or inactivating sub-grain-boundaries, as employed in the prior art, are not required. Therefore, a semiconductor substrate comprising a recrystallized semiconductor film, formed on the substrate body via an insulating film, in which sub-grain-boundaries are inactivated, can be obtained by fewer process steps than in the prior art.

Embodiment 3

Figure 4A:
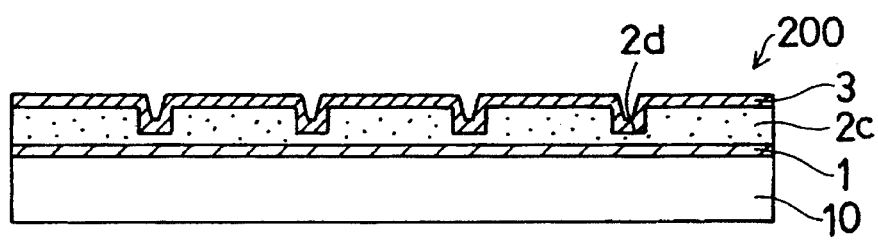
FIGS. 4(a) to 4(c) are cross-sectional views illustrating process steps for producing a semiconductor substrate in accordance with a third embodiment of the present invention.
Figure 4B:
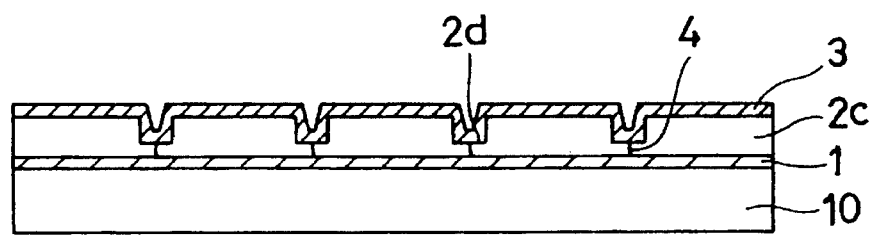
Figure 4C:
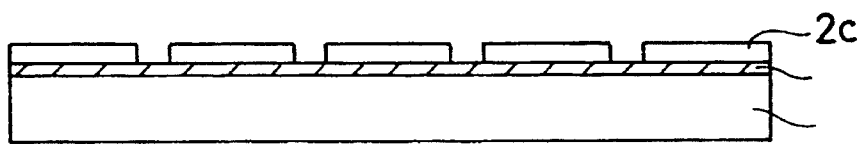

FIGS. 4(a) to 4(c) are cross-sectional views illustrating process steps for producing a semiconductor substrate in accordance with a third embodiment of the present invention. In the figures, the same reference numerals as those in FIGS. 1(a) to 1(e) designate the same or corresponding elements.

The process steps will be described with reference to the FIGS. 4(a)–4(c);

First, an insulating film 1 comprising a silicon oxide film is formed in a thickness of about 1 µm on a substrate 10 comprising, for example, monocrystalline silicon. A semiconductor film 2c comprising amorphous silicon or polycrystalline silicon is formed in a thickness of approximately 0.5 to 5 µm on the insulating film 1. Stripe-shaped grooves 2d of 10 to 20 µm width periodically arranged are formed on the semiconductor film 2c with an interval of approximately 100 to 200 µm. An insulating film 3 comprising a silicon oxide film and a silicon nitride film which are laminated is formed in a thickness of approximately 1 to 3 µm on the semiconductor film 2c. In this way, a semiconductor substrate 200 shown in FIG. 4(a) is obtained.

Next, a carbon strip heater (not shown) is disposed above the semiconductor substrate material 200 so that the length direction of the heater is perpendicular to the stripe direction of the stripe-shaped groove 2d, and the strip heater is scanned over the semiconductor substrate material 200 along the stripe direction of the stripe-shaped groove 2d from one end of the semiconductor material 200 to the opposite end at a prescribed speed of, for example, 1 mm/sec. Thereby the semiconductor film 2c is melted and recrystallized, the size of crystal grains is increased and electrical characteristics such as electric conductivity are improved. Then, thin portions of the semiconductor film 2c on which the stripe-shaped grooves 2d are formed are melted in a time shorter than thick portions on which no stripe-shaped groove 2d is formed. As a result, a temperature distribution is formed in the semiconductor film 2c, whereby sub-grain-boundaries 4 are generated at the portions of the semiconductor film 2c on which the stripe-shaped grooves 2d are formed. Here, the reason why the stripe-shaped grooves 2d are formed with an interval of approximately 100 to 200 µm is because if the stripe-shaped grooves 2d are formed with intervals larger than 200 µm, sub-grain-boundaries may be generated also at the thick portions of the semiconductor film 2c different from the portions of the semiconductor film 2 on which stripe-shaped grooves 2d are formed, that is, sub-grain-boundaries are generated unfavorably during unpredictable and irregular positions at zone melting recrystallization of the semiconductor film 2. The reason why the width of the stripe-shaped groove 2d is set approximately 10 to 20 µm is to generate sub-grain-boundaries with good controllability at portions of the semiconductor film 2c on which the stripe-shaped grooves 2d are formed, and if the width is outside of this range, sub-grain-boundaries may be unfavorably generated also at the thick portions of the semiconductor film 2 different from the portions of the semiconductor film 2 on which the stripe-shaped grooves 2d are formed.

Figure 5A:
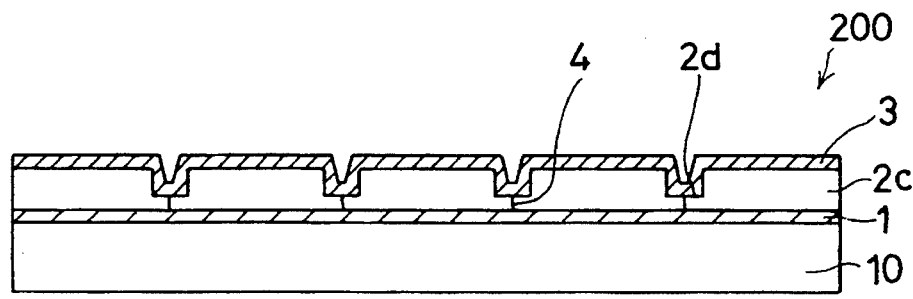
FIGS. 5(a) and 5(b) are a cross-sectional view and a plan view, respectively, illustrating an inner structure of a semiconductor film for zone melting recrystallization in a process step of the third embodiment.
Figure 5B:
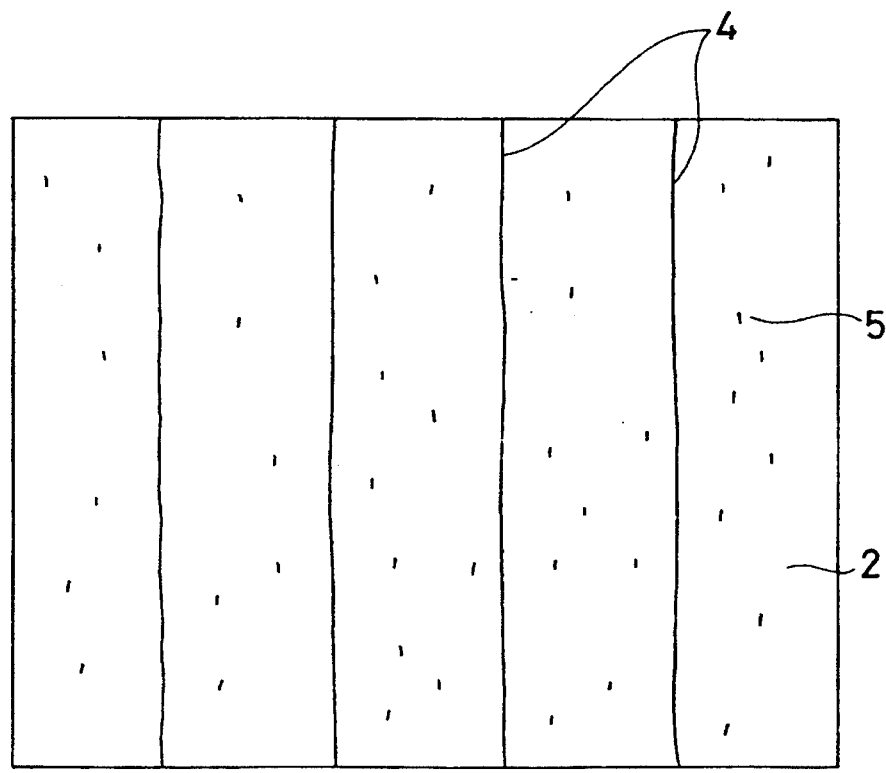

FIG. 5(a) is a cross-sectional view and FIG. 5(b) is a plan view, illustrating the semiconductor substrate material 200 after the above-described process steps, and showing a state where sub-grain-boundaries 4 are generated at portions of the semiconductor film 2c on which the stripe-shaped grooves 2d are formed. Reference numeral 5 designates a dislocation.

Next, the insulating film 3 is removed with hydrofluoric acid in aqueous solution, and, subsequently, in a chloride ambient at 1100° C., the entire surface of the semiconductor film 2c is etched away with hydrogen chloride gas to a prescribed depth to expose the insulating film 1 at portions of the semiconductor film 2c corresponding to the positions of stripe-shaped grooves 2d. Thus, the portions of the semiconductor film 2c on which the stripe-shaped grooves 2d are formed, are completely removed and thereby sub-grain-boundaries 4 are removed, resulting in the semiconductor film 2c including no sub-grain-boundary 4.

In the process steps for producing the semiconductor substrate of this embodiment, after the semiconductor film 2c is recrystallized, sub-grain-boundaries 4 generated in the semiconductor film 2c are removed only by removing the semiconductor film 2c to a prescribed depth from its surface. In this way, a semiconductor substrate, including a recrystallized semiconductor film formed on the substrate body via an insulating film, in which semiconductor film sub-grain-boundaries are inactivated, can be obtained by fewer process steps than in the prior art.

Embodiment 4

Figure 6:
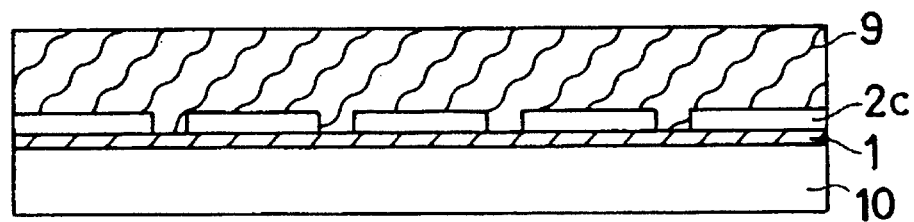
FIG. 6 is a cross-sectional view illustrating a semiconductor substrate structure in accordance with a fourth embodiment of the present invention.

FIG. 6 is a cross-sectional view illustrating a structure of a semiconductor substrate according to a fourth embodiment of the present invention. In the figure, the same reference numerals as those in FIGS. 4(a) to 4(c) designate the same or corresponding elements.

In a semiconductor substrate of this embodiment as shown in the figure, a further semiconductor film 9 comprising Si is epitaxially grown in a thickness of approximately 50 to 100 μm on the semiconductor substrate obtained in the third embodiment, i.e., the semiconductor substrate material shown in FIG. 5 from which an insulating film 3 and portions of the semiconductor film 2c under the grooves 2d are removed.

In the semiconductor substrate of this fourth embodiment, since crystal grain size is increased in the semiconductor film 2c which becomes a base for the semiconductor film 9 and sub-grain-boundaries are removed from the semiconductor film 2c, the semiconductor film 9 is grown to have superior crystallinity including no sub-grain-boundary according to the crystallinity of the semiconductor film 2c. In this semiconductor substrate of this fourth embodiment, the semiconductor film 9 is formed in a thickness of approximately 50 to 100 μm and can be effectively utilized as a semiconductor substrate for a solar battery.

Embodiment 5

FIG. 7(a) to 7(d) are cross-sectional views illustrating process steps for producing a semiconductor substrate in accordance with a fifth embodiment of the present invention. In the figures, the same reference numerals as those in FIGS. 1(a)–1(e) designate the same or corresponding elements.

The process steps will be described with reference to the figures mentioned below.

Figure 7:
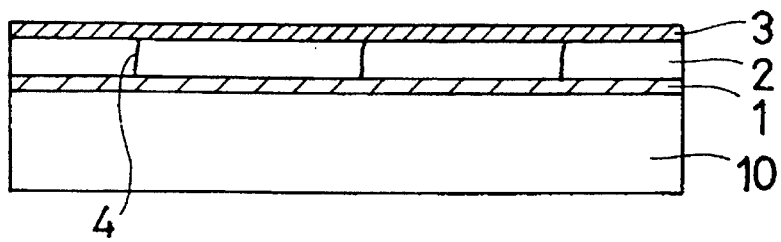
FIGS. 7(a) to 7(d) are cross-sectional views illustrating process steps for producing a semiconductor substrate in accordance with a fifth embodiment of the present invention.
Figure 7:
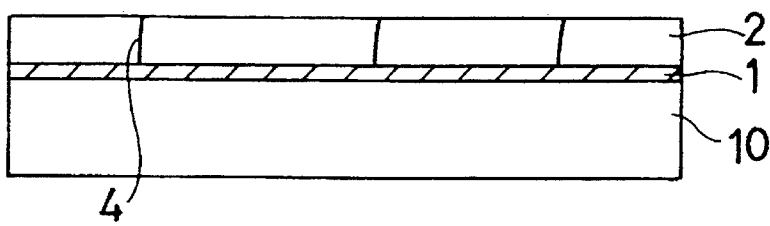
Figure 7:
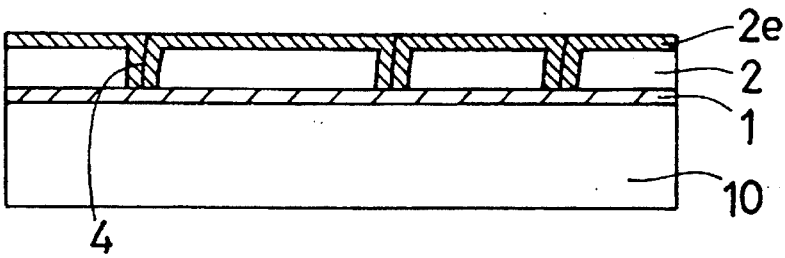
Figure 7:
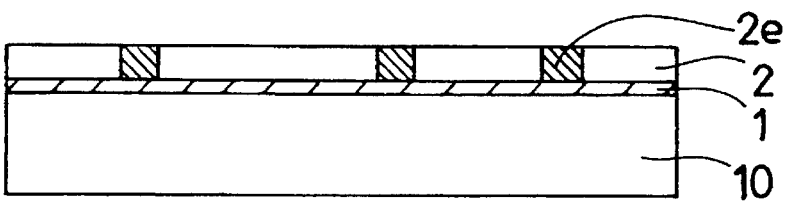
Figure 18A:
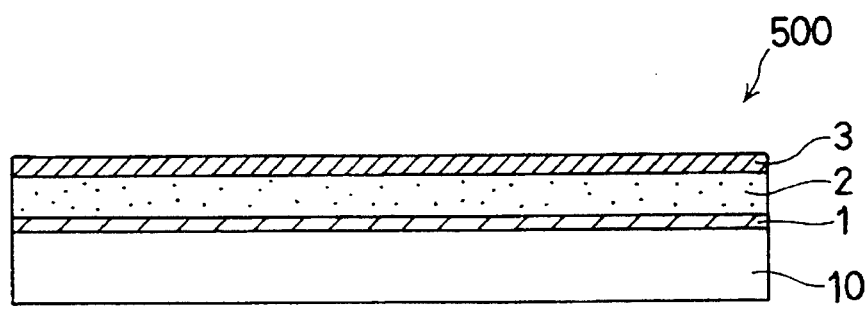
FIGS. 18(a) and 18(b) are cross-sectional views illustrating process steps for producing a semiconductor substrate in accordance with the prior art.
Figure 18B:
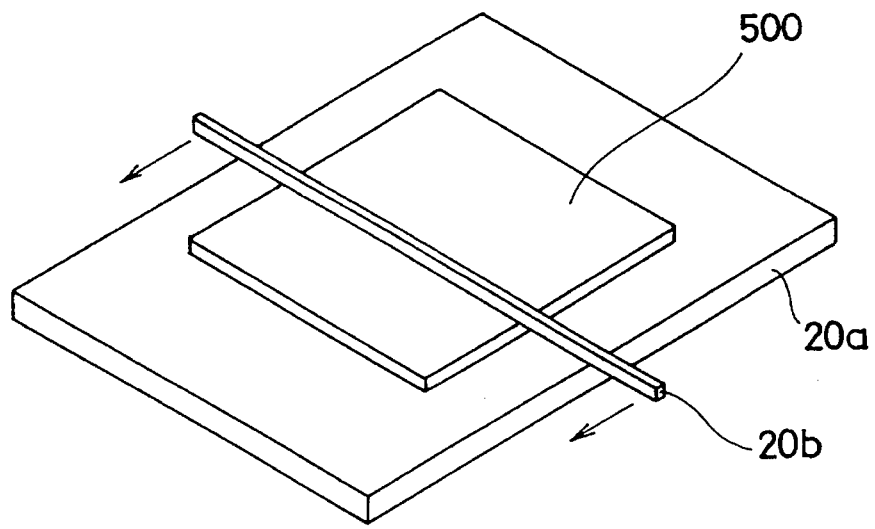
Figure 19:
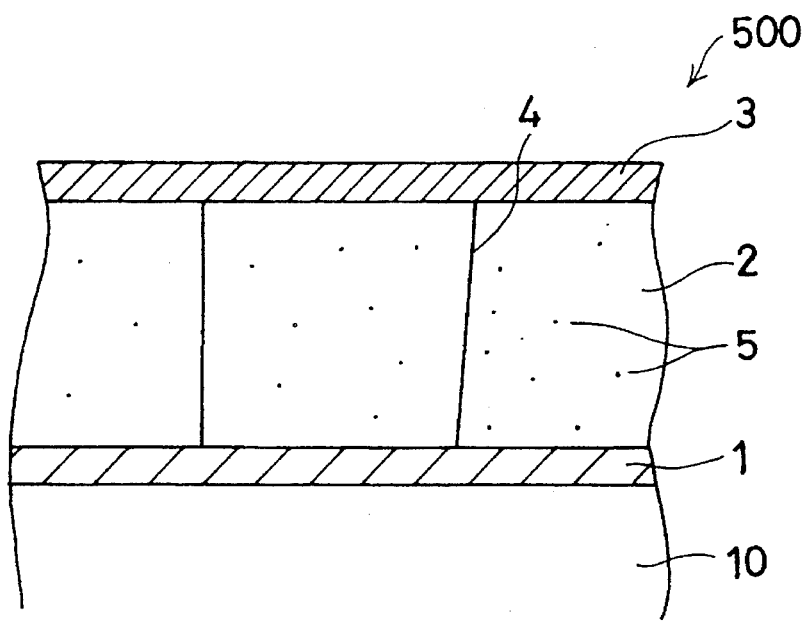
FIGS. 19(a) and 19(b) are a cross-sectional view and a plan view, respectively, illustrating an inner structure of a semiconductor film for zone melting recrystallization in a process step of the prior art.
Figure 19:
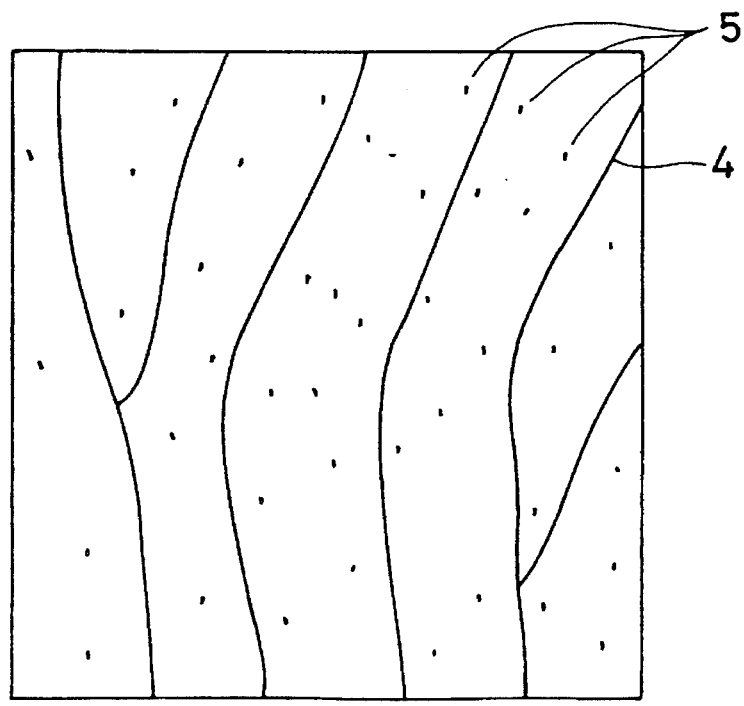
Figure 20A:
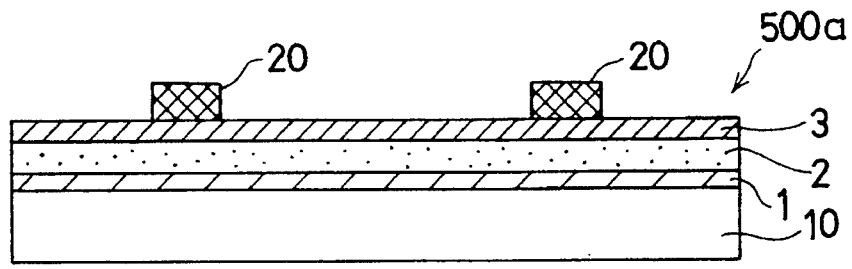
FIGS. 20 (a) and 20(b) are cross-sectional views illustrating prior art process steps for producing a semiconductor substrate.
Figure 20B:
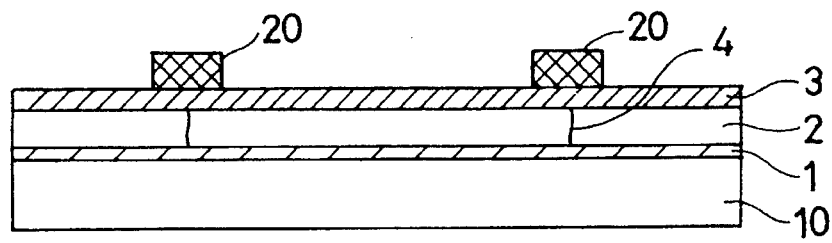
Figure 21A:
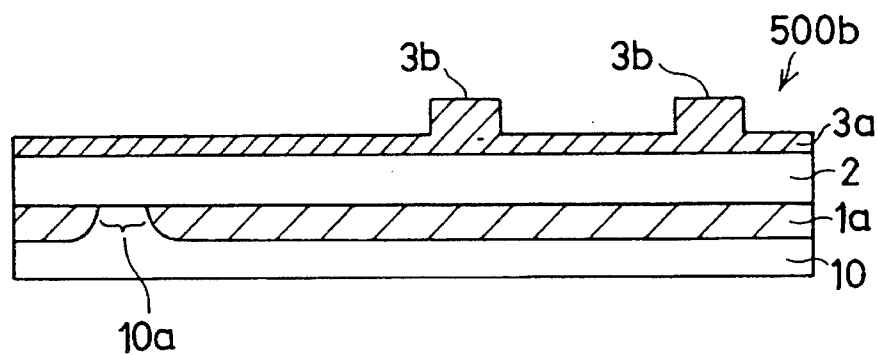
FIGS. 21 (a) and 21(b) are cross-sectional views illustrating prior art process steps for producing a semiconductor substrate.
Figure 21B:
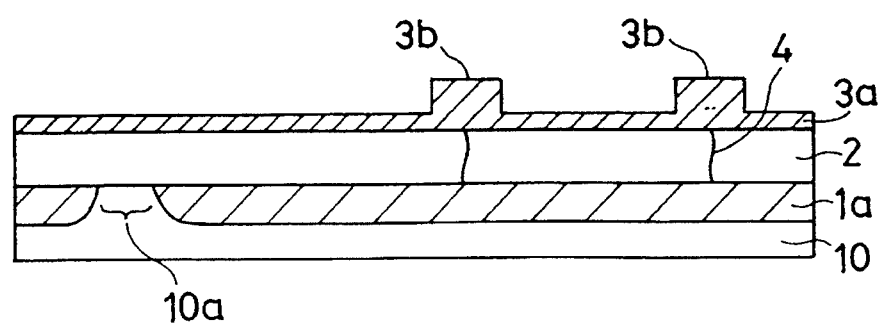

First, the same semiconductor substrate material as the semiconductor substrate material 500 shown in FIG. 18(a) is produced, and zone melting recrystallization of the semiconductor film is carried out without controlling generating positions of sub-grain-boundaries as shown in FIG. 18(b), resulting in a semiconductor substrate in a state shown in FIG. 7(a).

Next, as shown in FIG. 7(b), the insulating film 3 is etched away with hydrofluoric acid in aqueous solution. Thereafter as shown in FIG. 7(c), the entire surface of the exposed semiconductor film 2 is oxidized to form oxidized region 2e. Then, the portions of the semiconductor film 2, in which sub-grain-boundaries 4 are produced, are oxidized simultaneously because bonding strength between atoms of those semiconductor film at those portions is smaller than at the other portions and oxidation is likely to proceed.

Next, as shown in FIG. 7(d), the entire surface of the semiconductor film 2 is etched away to a prescribed depth from its surface with, for example, potassium hydroxide in aqueous solution to expose non-oxidized regions of the semiconductor film 2, resulting in the semiconductor film 2 in which sub-grain-boundaries 4 are inactivated.

In process steps for producing the semiconductor substrate of this fifth embodiment, although the number of sub-grain-boundaries cannot be reduced and generating positions of sub-grain-boundaries cannot be controlled, the semiconductor film 2 in which sub-grain-boundaries are certainly inactivated can be obtained by a small number of process steps.

Embodiment 6

Figure 8:
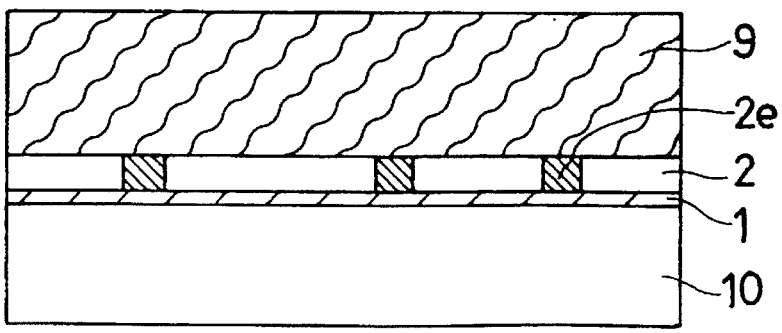
FIG. 8 is a cross-sectional view illustrating a semiconductor substrate structure in accordance with a sixth embodiment of the present invention.

FIG. 8 is a cross-sectional view illustrating a structure of a semiconductor substrate in accordance with a sixth embodiment of the present invention. In the figure, the same reference numerals as those in FIGS. 7(a)–7(d) designate the same or corresponding elements.

In this semiconductor substrate shown in FIG. 8, a further semiconductor film 9 of a 50 to 100 μm thickness is epitaxially grown on the semiconductor substrate of the fifth embodiment.

The semiconductor substrate of this sixth embodiment includes the semiconductor film 9 of 50 to 100 μm thickness, having superior crystallinity, free of sub-grain-boundaries, and the same effects as those in the fourth embodiment can be obtained.

Embodiment 7

Figure 9:
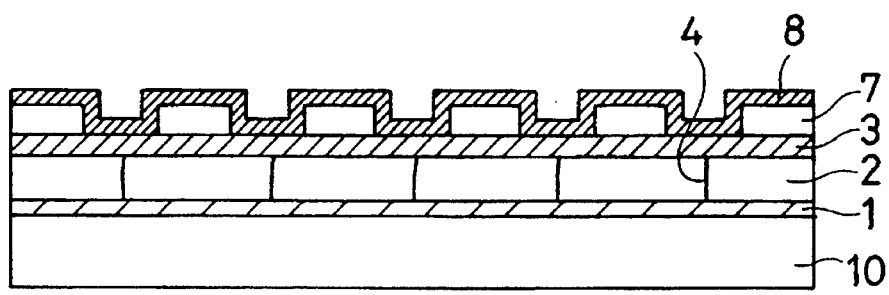
FIGS. 9(a) and 9(b) are cross-sectional views illustrating process steps for producing a semiconductor substrate in accordance with a seventh embodiment of the present invention.
Figure 9:
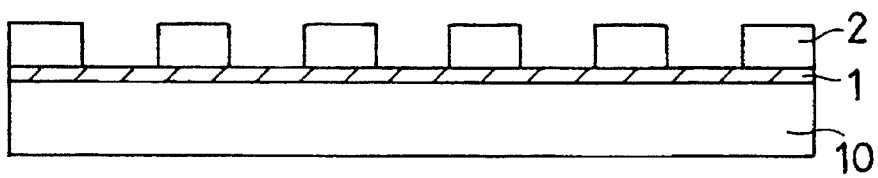

FIGS. 9(a) and 9(b) are cross-sectional views illustrating process steps for producing a semiconductor substrate in accordance with a seventh embodiment of the present invention. In the figures, the same reference numerals as those in FIGS. 1(a)–1(e) designate the same or corresponding elements.

The process steps will be described below.

First, as shown in FIG. 9(a), the same semiconductor substrate material as the semiconductor substrate material 100 of the first embodiment is produced, and zone melting recrystallization of the semiconductor film 2 is carried out.

Next, upper portions of the insulating film 8 above the stripe-shaped semiconductor films 7 are covered with photoresist, and the exposed surface portions of the insulating film 8 are etched away with hydrofluoric acid in aqueous solution, and further, the exposed insulating film 3 is etched away. Thereafter, the photoresist is removed. Subsequently, concave portions on the substrate formed by the above-described etching removal are buried with photoresist, and the remaining insulating film 8 is etched away with hydrofluoric acid in aqueous solution. Thereafter the stripe-shaped semiconductor films 7 are etched away with potassium hydroxide in aqueous solution, and further, the remaining insulating film 3 is removed with hydrofluoric acid in aqueous solution, resulting in a semiconductor substrate in a state shown in FIG. 9(b), and the semiconductor film 2 from which sub-grain-boundaries 4 are removed can be obtained.

In the process step for producing a semiconductor substrate of this embodiment, generating positions of sub-grain-boundaries 4 are controlled by stripe-shaped semiconductor films 7 formed above the semiconductor film 2, and further, the process for removing the sub-grain-boundary 4 is conducted with reference to the stripe-shaped semiconductor films 7. Thus, a semiconductor substrate including a recrystallized semiconductor film formed on the substrate body via an insulating film, in which semiconductor film sub-grain-boundaries are inactivated, can be obtained by fewer process steps than in the prior art.

Embodiment 8

Figure 10:
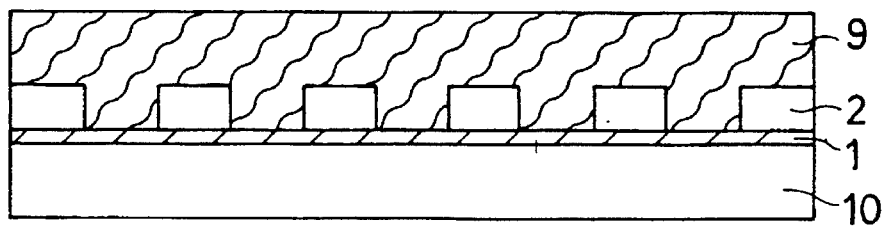
FIG. 10 is a cross-sectional view illustrating a semiconductor substrate structure in accordance with an eighth embodiment of the present invention.

FIG. 10 is a cross-sectional view illustrating a structure of a semiconductor substrate in accordance with an eighth embodiment of the present invention. In the figure, the same reference numerals as those in FIGS. 7(a) and 8 to 7(d) designate the same or corresponding elements.

In this semiconductor substrate, a further semiconductor film 9 of 50 to 100 μm thickness is epitaxially grown on the semiconductor substrate of the seventh embodiment.

The semiconductor substrate of this embodiment includes the semiconductor film 9 having a thickness of 50 to 100 μm and superior crystallinity, free of sub-grain-boundary, and the same effects as those in the fourth embodiment can be obtained.

Embodiment 9

Figure 11:
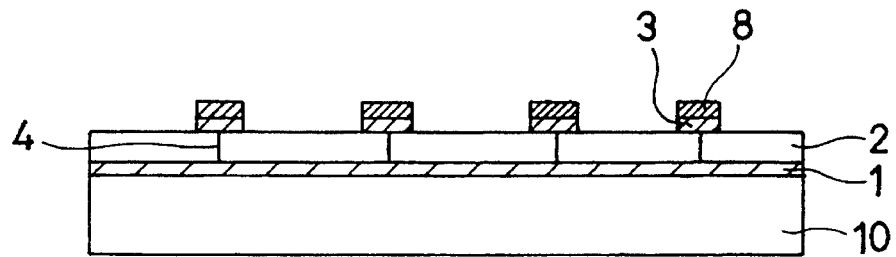
FIG. 11 is a cross-sectional view illustrating a process step of producing a semiconductor substrate in accordance with a ninth embodiment of the present invention.
Figure 12:
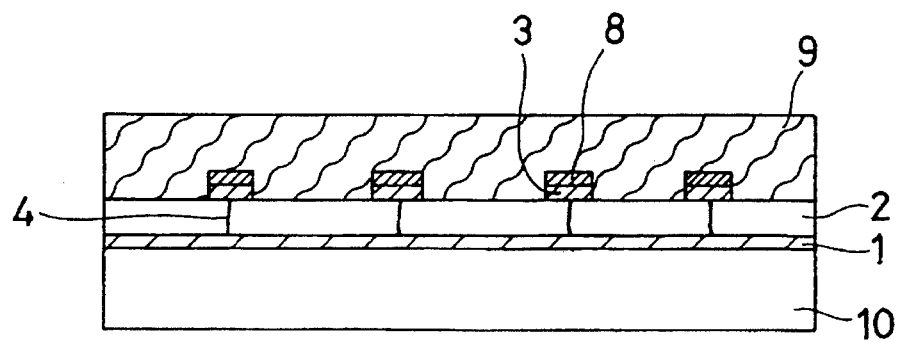
FIG. 12 is a cross-sectional view illustrating a semiconductor substrate structure in accordance with the ninth embodiment of the present invention.

FIG. 12 is a cross-sectional view illustrating a structure of a semiconductor substrate in accordance with a ninth embodiment of the present invention. FIG. 11 is a cross-sectional view illustrating a process step for producing the semiconductor substrate. In these figures, the same reference numerals as those in FIGS. 1(a) to 1(e) designate the same or corresponding elements.

The process steps will be described below.

First, the same semiconductor substrate material as the semiconductor substrate material 100 of the first embodiment is produced, and zone melting recrystallization of the semiconductor film 2 is carried out. Subsequently, the insulating film 8 in concave portions between the stripe-shaped semiconductor films 7 is covered with photoresist. In this state, exposed portions of the insulating film 8 are etched away with hydrofluoric acid in aqueous solution, and further, the stripe-shaped semiconductor films 7 are etched away with potassium hydroxide in aqueous solution. Thereafter, the exposed insulating film 3 is removed resulting in the semiconductor substrate in a state shown in FIG. 11.

A semiconductor film 9 is epitaxially grown in a thickness of 50 to 100 μm on the above-described semiconductor substrate, resulting in a semiconductor substrate shown in FIG. 12.

The semiconductor substrate of this ninth embodiment comprises the semiconductor film 9 having a thickness of 50 to 100 μm and superior crystallinity, free of sub-grain-boundaries, and the same effects as those in the fourth embodiment can be obtained.

Embodiment 10

FIG. 13(a) and 13(b) are cross-sectional views illustrating process steps for producing a semiconductor substrate in accordance with a tenth embodiment of the present invention. In the figures, the same reference numerals as those in FIGS. 1(a)–1(e) and FIGS. 18(a) and 18(b) designate the same or corresponding elements.

The process steps will be described below.

First of all, the semiconductor substrate material 500 shown in FIG. 18(a) is produced.

Next, the semiconductor film 2 in the semiconductor substrate material 500 is recrystallized by the same method as in the prior art.

Figure 22:
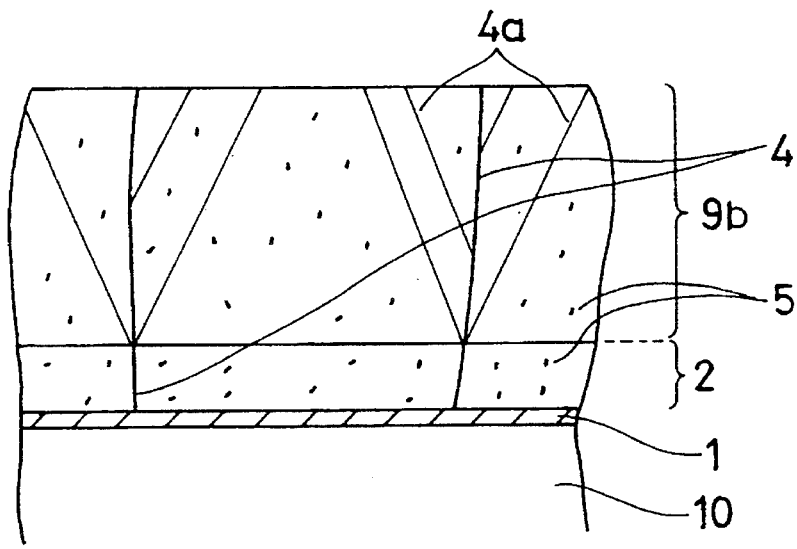
FIGS. 22(a) and 22(b) are a cross-sectional view and a plan view, illustrating an inner structure of a semiconductor film which is epitaxially grown on a recrystallized semiconductor film without removing the recrystallized surface portion.
Figure 22:
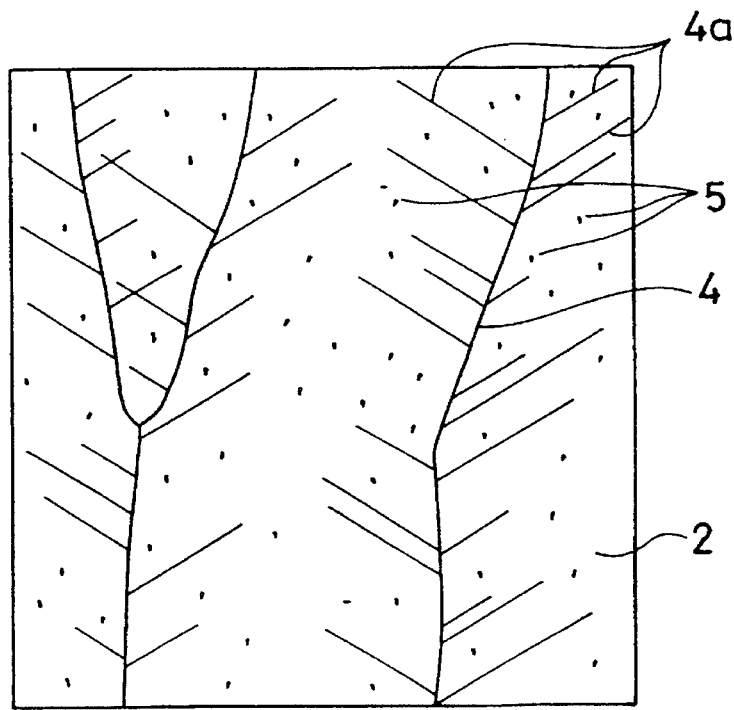

FIG. 14 is a diagram showing oxygen concentration distributions in the depth direction in the semiconductor film 2 recrystallized by the above process step. In the figure, curve 15 shows a result obtained by analyzing the portions of the semiconductor film 2 in which sub-grain-boundaries are generated, and curve 16 shows a result obtained by analyzing the portion of the semiconductor film 2 in which no sub-grain-boundary is generated. As shown in the figure, oxygen concentration at the portions where sub-grain-boundaries are generated is high at a surface region of the semiconductor film as compared with that at portion where no sub-grain-boundary is generated, and is almost the same at a region of 5000 Å depth or more from the semiconductor film surface. Here, when the concentration of an impurity such as oxygen exceeds the degree of melting in solid state in the semiconductor film, the impurities precipitate as compounds with semiconductor atoms (for example, $SiO_2$ when the semiconductor film comprises Si). The precipitated compounds become sources of line defects in the epitaxial layer when a further semiconductor film is epitaxially grown on the semiconductor film. FIG. 22(a) and 22(b) are a cross-sectional view and a plan view of a state where a further semiconductor film 9b is epitaxially grown on the semiconductor film 2. As shown in the figures, in the semiconductor film 9b, line defects 4a as well as the sub-grain-boundaries 4, originated from sub-grain-boundaries 4 in the semiconductor film 2 containing, are generated. Therefore, in the next process step, after removing the surface portion of the semiconductor film 2 a high concentration of oxygen, a further semiconductor film is epitaxially grown.

First, the insulating film 3 is removed with hydrofluoric acid in aqueous solution to expose the semiconductor film 2. Thereafter the semiconductor film 2 is etched to a depth of 5000 Å from the surface with hydrogen chloride gas in hydrogen heated at about 1100° C., resulting in a semiconductor substrate in the state shown in FIG. 13(a). In the figure, reference numeral 2f designates a semiconductor film whose surface portion is etched to a depth of 5000 Å or more.

Next, as shown in FIG. 13(b), for example, a silicon film is epitaxially grown in a thickness of 50 to 100 μm on the semiconductor film 2f to produce a semiconductor film 9a. Then, since the above-described etching process of the semiconductor film 2 is conducted with hydrogen chloride gas in hydrogen heated at about 1100° C., the epitaxial growth process of the semiconductor film 9a and the etching process can be conducted in the same atmosphere, i.e., in the same chamber. Thereby, the semiconductor film 9a is epitaxially grown while keeping clean the surface of the semiconductor film 2f exposed by etching.

In the process steps for producing the semiconductor substrate of this tenth embodiment, the recrystallized semiconductor film 2 is etched to a depth of 5000 Å from its surface to remove the portions where oxygen atoms are segregated at high concentration, and the semiconductor film 9a is epitaxially grown in a thickness of 50 to 100 μm on a semiconductor film 2. Thus, a semiconductor substrate comprising the semiconductor film 9a formed on the substrate body via an insulating film, of 50 to 100 μm thickness free of line defects 4a, can be obtained.

Embodiment 11

FIG. 15(a) to 15(f) are cross-sectional views illustrating process steps for producing a semiconductor substrate in accordance with an eleventh embodiment of the present invention. In the figures, the same reference numerals as those in FIGS. 1(a)–1(e) designate the same or corresponding elements.

A description will be given of the process steps below.

Figure 15A:
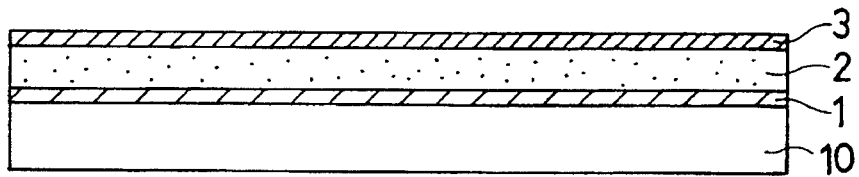
FIGS. 15(a) to 15(f) are cross-sectional views illustrating process steps for producing a semiconductor substrate in accordance with an eleventh embodiment of the present invention.

First, as shown in FIG. 15(a), the same semiconductor substrate material as the semiconductor substrate material 500 shown in FIG. 18(a) is produced.

Figure 15B:
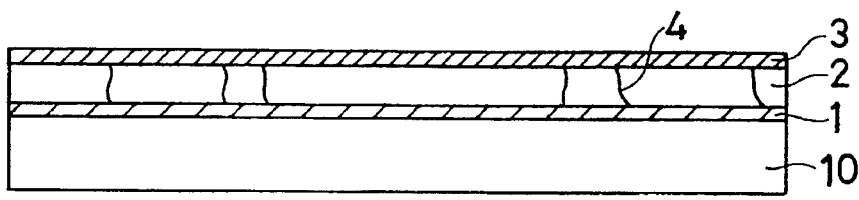

Next, as shown in FIG. 15(b), as in the prior art, zone melting recrystallization of the semiconductor film 2 is carried out without controlling generating positions of sub-grain-boundaries 4.

Figure 15C:
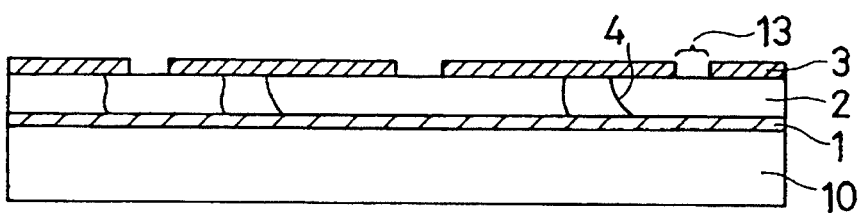
Figure 16:
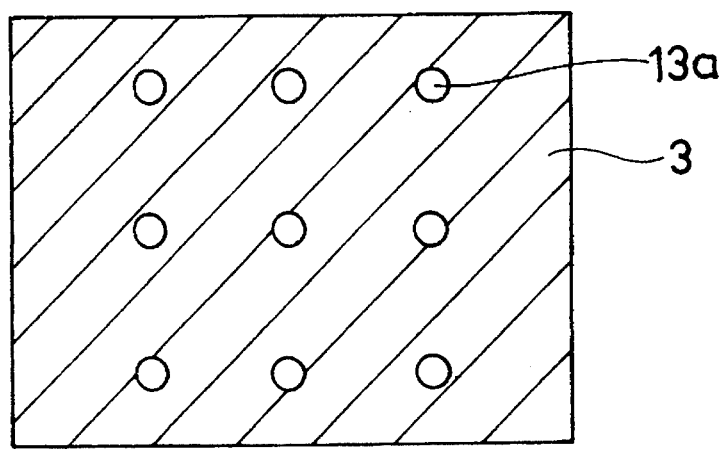
FIGS. 16(a) to 16(c) are plan views illustrating an insulating film used in the process steps shown in FIGS. 15(a) to 15(b).
Figure 16:
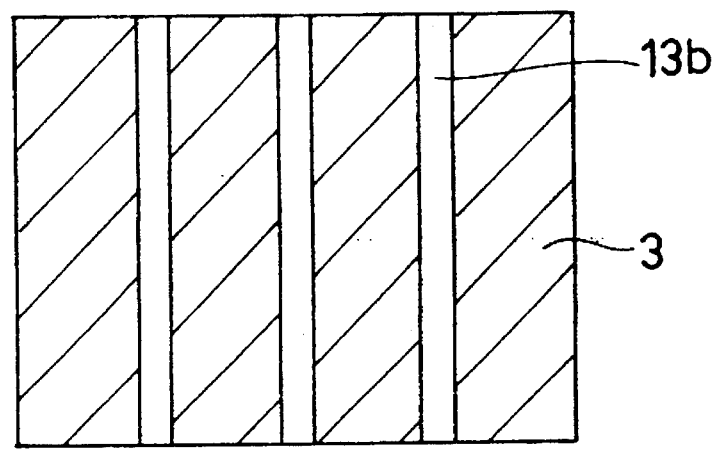
Figure 16:
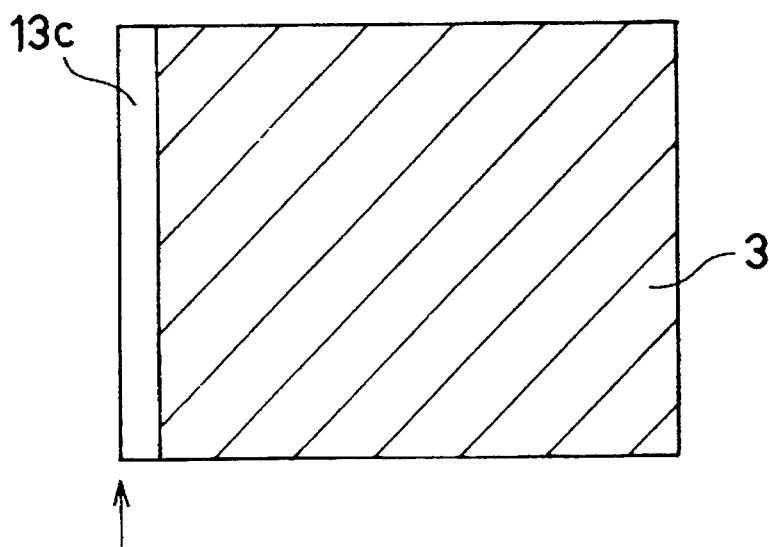

Next, as shown in FIG. 15(c), apertures 13 are formed in the insulating film 3 not overlapping with generating positions of sub-grain-boundaries 4. FIGS. 16(a)–16(c) are views concretely illustrating states where the apertures 13 are formed. FIG. 16(a) shows a state where a plurality of round apertures 13a of 1 to 10 μm φ are formed, FIG. 16(b) shows a state in which a plurality of stripe-shaped apertures 13b of 1 to 10 μm width are formed, and FIG. 16(c) shows a state where a stripe-shaped aperture 13c of 1 to 10 μm width is formed only at an end of the semiconductor substrate.

Figure 15D:
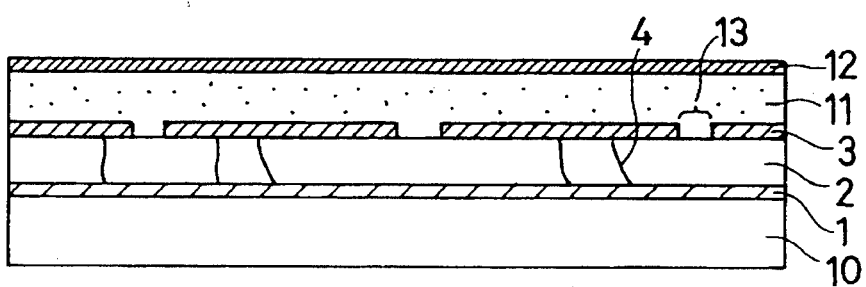

Next, as shown in FIG. 15(d), a semiconductor film 11 of approximately 0.5 to 1 μm thickness comprising amorphous silicon or polycrystalline silicon is formed on the insulating film 3 on which stripe-shaped apertures 13 are formed. Furthermore, an insulating film 12 comprising a silicon nitride film and a silicon oxide film which are laminated is formed on the semiconductor film 11.

Figure 15E:
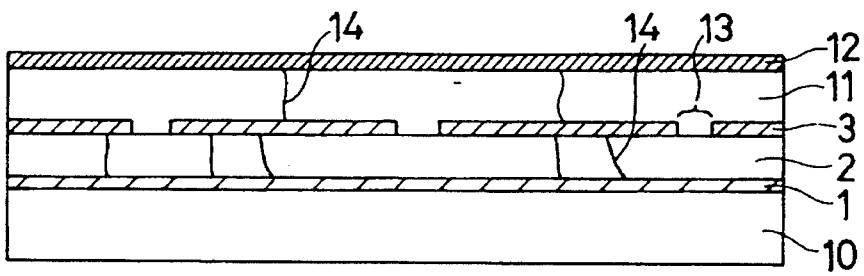
Figure 15F:
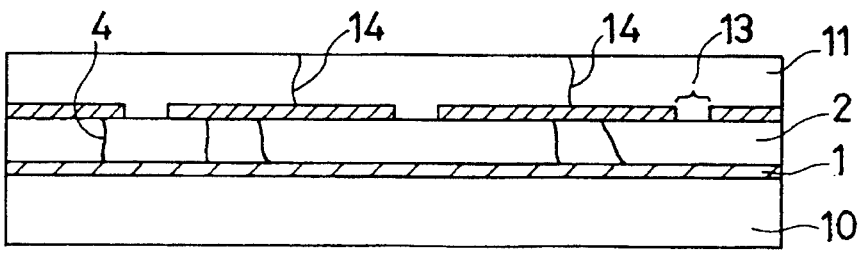

Next, a heating means such as a carbon strip heater, not shown, is disposed above the insulating film 12, and the heating means is scanned at a prescribed speed in a prescribed direction to conduct zone melting recrystallization of the semiconductor film 11 as shown in FIG. 15(e), and then the insulating film 12 is removed, resulting in a semiconductor substrate shown in FIG. 15(f). Then, the zone melting recrystallization proceeds in the semiconductor film 11 using portions of the semiconductor film 2 of good crystallinity free of sub-grain-boundaries as seeds through the apertures 13 in the insulating film 3, whereby the semiconductor film 11 is recrystallized to have remarkably good crystallinity.

Figure 17:
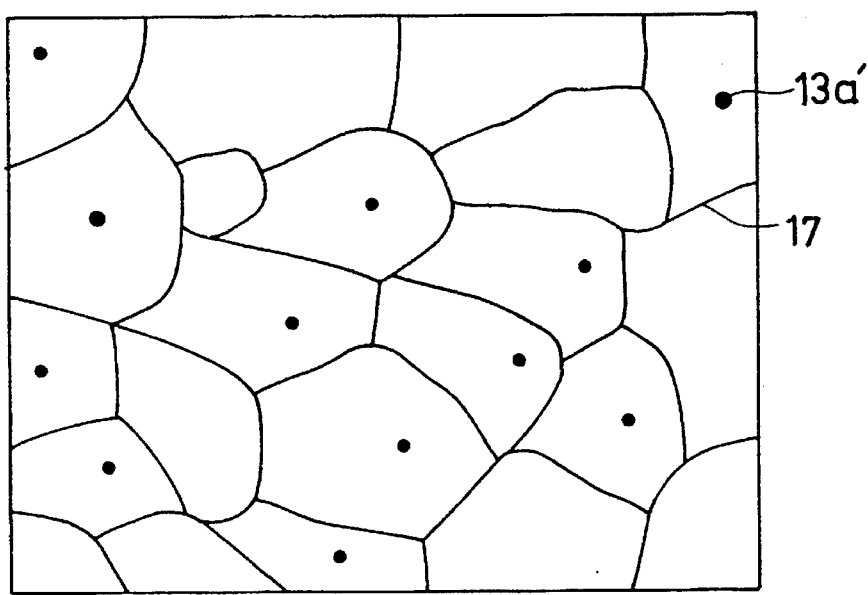
FIG. 17 is a plan view illustrating a recrystallized semiconductor film in a process step of the eleventh embodiment.

FIG. 17 is an enlarged typical view illustrating a state in the semiconductor film 11 to which zone melting recrystallization is conducted when the insulating film 3 is in the state shown in FIG. 16(a). In the figure, reference numeral 13a' designates a trace showing that the recrystallization of the semiconductor film 11 from the apertures 13a in the insulating film 3. Reference numeral 17 designates a grain-boundary which is produced by collision of different crystallized regions in which the recrystallization proceeds from the apertures 13a. The grain-boundary 17 is not an aggregation of crystalline defects such as sub-grain-boundaries, at which the crystal direction has slipped a little, and has no effect on electrical characteristics at all.

In the above-described process steps for producing a semiconductor substrate of this embodiment, during the zone melting recrystallization of the semiconductor film 11, the semiconductor film 11 contacts portions of the zone-melting-recrystallized semiconductor film 2 of good crystallinity free of sub-grain-boundaries, through the apertures 13 in the insulating film 3. Therefore the zone melting recrystallization proceeds while the contact portions serve as seeds, whereby the crystallinity of the zone-melting-recrystallized semiconductor film 11 is remarkably improved with no sub-boundaries produced in the semiconductor film 11. Thus, a semiconductor substrate including a semiconductor film formed on the substrate body via an insulating film, having remarkably improved crystallinity, free of sub-grain-boundaries, can be obtained.

In the above-described embodiment of the present invention, a monocrystalline silicon substrate is employed as a semiconductor substrate and a semiconductor film comprising amorphous silicon or polycrystalline silicon is employed as a semiconductor film which is recrystallized, while a semiconductor substrate comprising metal, glass, or ceramics, can also be employed and a semiconductor film comprising other semiconductor materials can also be employed as a semiconductor film which is recrystallized whereby the same effects as those in the above-described embodiments can be obtained.

What is claimed is:

1. A method of producing a semiconductor structure including a semiconductor film disposed on an insulating film that is disposed on a semiconductor substrate body comprising:

preparing a semiconductor substrate having a front surface and a rear surface opposite to said front surface;

forming a first insulating film, a first semiconductor film, and a second insulating film on said front surface of said semiconductor substrate successively;

forming spaced apart stripe-shaped second semiconductor films of constant width on said second insulating film and arranged periodically with a constant period;

covering said second semiconductor films with a third insulating film;

zone melting and recrystallizing said first semiconductor film in a direction parallel to said stripe-shaped second semiconductor films, moving from one end of said substrate to an opposite end;

removing said third insulating film and portions of said second insulating film leaving portions of said second insulating film sandwiched between said first semiconductor film and said second semiconductor film;

oxidizing said second semiconductor film and said first semiconductor film exposed in the removing step; and removing the remaining portions of said second insulating film.

2. The production method as defined in claim 1, comprising epitaxially growing a third semiconductor film after removing the remaining portions of said second insulating film.

3. A method of producing a semiconductor structure including a semiconductor film disposed on an insulating film that is disposed on a semiconductor substrate body comprising:

preparing a semiconductor substrate having a front surface and a rear surface opposite to said front surface;

forming a first insulating film, a first semiconductor film, and a second insulating film on said front surface of said semiconductor substrate successively;

forming spaced apart stripe-shaped second semiconductor films of constant width on said second insulating film and arranged periodically with a constant period;

covering said second semiconductor films with a third insulating film;

zone melting and recrystallizing said first semiconductor film, moving from one end of said substrate to an opposite end in a direction parallel to said stripe-shaped second semiconductor films;

removing said third insulating film and said second insulating film leaving portions of said third insulating film sandwiched between said first and second semiconductor films;

diffusing dopant impurities into said second semiconductor films and portions of said first semiconductor film that are exposed by the removing step; and removing the remaining portions of said second insulating film.

4. The production method as defined in claim 3 comprising epitaxially growing a third semiconductor film after removing the remaining portions of said second insulating film.

5. A method of producing a semiconductor structure including a semiconductor film disposed on an insulating film that is disposed on a semiconductor substrate body comprising:

preparing a semiconductor substrate having a front surface and a rear surface opposite to said front surface;

forming a first insulating film, a semiconductor film, and a second insulating film on said front surface of said semiconductor substrate successively;

zone melting and recrystallizing said semiconductor film, moving from one end of said substrate to an opposite end;

removing said second insulating film to expose a surface of said semiconductor film and oxidizing said semiconductor film at the surface to produce an oxide film and oxidize sub-grain-boundaries in said semiconductor film; and etching and removing portions of said oxide film to expose unoxidized portions of said semiconductor film.

6. The production method as defined in claim 5 comprising epitaxially growing a second semiconductor film, after exposing unoxidized portions of said semiconductor film, on said semiconductor film.

7. A method of producing a semiconductor structure including a semiconductor film disposed on an insulating film that is disposed on a semiconductor substrate body comprising:

preparing a semiconductor substrate having a front surface and a rear surface opposite to said front surface;

forming a first insulating film, a first semiconductor film, and a second insulating film on said front surface of said semiconductor substrate successively;

forming spaced apart stripe-shaped second semiconductor films of constant width on said second insulating film and arranged periodically with a constant period;

covering said second semiconductor films with a third insulating film;

zone melting and recrystallizing said first semiconductor film, moving from one end of said substrate to an opposite end in a direction parallel to said stripe-shaped second semiconductor films;

masking portions opposite said stripe-shaped second semiconductor films with photoresist, etching and removing exposed portions of said third insulating film, exposed portions of said second insulating film, and said first semiconductor film to form concavities; and burying the concavities formed by the etching step with photoresist, etching and removing the remaining portions of said third insulating film, exposed remaining portions of said stripe-shaped second semiconductor films, and exposed remaining portions of said second insulating film.

8. The production method as defined in claim 7 comprising epitaxially growing a third semiconductor film on the remaining portions of said first semiconductor film and on exposed portions of said first insulating film after completely removing said second insulating film.

9. A method of producing a semiconductor structure including a semiconductor film disposed on an insulating film that is disposed on a semiconductor substrate body comprising:

preparing a semiconductor substrate having a front surface and a rear surface opposite to said front surface;

forming a first insulating film, a first semiconductor film, and a second insulating film on said front surface of said semiconductor substrate successively;

forming spaced apart stripe-shaped second semiconductor films of constant width on said second insulating film and arranged periodically with a constant period;

covering said second semiconductor films with a third insulating film;

zone melting and recrystallizing said first semiconductor film, moving from one end of said substrate to an opposite end in a direction parallel to said stripe-shaped second semiconductor films;

masking portions opposite said third insulating film between adjacent stripe-shaped second semiconductor films, etching exposed portions of said third insulating film, said stripe-shaped second semiconductor films, and said second insulating film; and removing said photoresist and thereafter epitaxially growing a third semiconductor film.

10. A method of producing a semiconductor structure including a semiconductor film disposed on an insulating film that is disposed on a semiconductor substrate body comprising:

preparing a semiconductor substrate having a front surface and a rear surface opposite to said front surface;

forming a first insulating film, a first semiconductor film, and a second insulating film on said front surface of said semiconductor substrate successively;

zone melting and recrystallizing said first semiconductor film, moving from one end of said substrate to an opposite end;

forming apertures in said second insulating film at positions not overlapping sub-grain-boundaries generated in said first semiconductor film during zone melting and recrystallizing;

epitaxially growing a second semiconductor film on said insulating film;

forming a third insulating film on said second semiconductor film; and zone melting and recrystallizing said second semiconductor film from one end of said substrate to an opposite end.

* * * * *